United States Patent
Luo et al.

(10) Patent No.: US 10,340,373 B2
(45) Date of Patent: Jul. 2, 2019

(54) REVERSE CONDUCTING IGBT

(71) Applicant: University of Electronic Science and Technology of China, Chengdu (CN)

(72) Inventors: Xiaorong Luo, Chengdu (CN); Gaoqiang Deng, Chengdu (CN); Kun Zhou, Chengdu (CN); Qing Liu, Chengdu (CN); Linhua Huang, Chengdu (CN); Tao Sun, Chengdu (CN); Bo Zhang, Chengdu (CN)

(73) Assignee: University of Electronic Science and Technology of China, Chengdu (CN)

(*) Notice: Subject to any disclaimer, the term of this patent is extended or adjusted under 35 U.S.C. 154(b) by 68 days.

(21) Appl. No.: 15/600,795

(22) Filed: May 22, 2017

(65) Prior Publication Data
US 2018/0061972 A1 Mar. 1, 2018

(30) Foreign Application Priority Data

Aug. 31, 2016 (CN) .......................... 2016 1 0786770

(51) Int. Cl.
*H01L 29/06* (2006.01)
*H01L 29/08* (2006.01)
(Continued)

(52) U.S. Cl.
CPC ...... *H01L 29/7397* (2013.01); *H01L 29/0634* (2013.01); *H01L 29/0804* (2013.01); *H01L 29/0834* (2013.01); *H01L 29/1095* (2013.01); *H01L 29/7395* (2013.01); *H01L 29/7416* (2013.01); *H01L 29/8611* (2013.01)

(58) Field of Classification Search
None
See application file for complete search history.

(56) References Cited

U.S. PATENT DOCUMENTS

| 2007/0023830 | A1* | 2/2007 | Pfirsch | ............... | H01L 29/0634 257/341 |
| 2009/0283799 | A1* | 11/2009 | Ruething | ............ | H01L 29/0834 257/143 |

(Continued)

FOREIGN PATENT DOCUMENTS

CN 202977426 U 6/2013

OTHER PUBLICATIONS

Hideki Takahashi et al, 1200V Reverse Conducting IGBT, 04 ISPSD, Proceedings of 2004 international Symposium on Power Semiconductor Devices & ICs, p. 133-136, Kitakyushu.

(Continued)

*Primary Examiner* — Fazli Erdem
*Assistant Examiner* — Scott R Wilson
(74) *Attorney, Agent, or Firm* — Gokalp Bayramoglu

(57) ABSTRACT

The present invention relates to the technical field of the power semiconductor device relates to a reverse conducting insulated gate bipolar transistor (RC-IGBT). The RC-IGBT comprises a P-type region, an N-type emitter region, a P-type body contact region, a dielectric trench, a collector region, and an electrical filed cutting-off region. The beneficial effect of the present invention is that, when compared with traditional RC-IGBT, the IGBT of the present invention can eliminate negative resistance effect and effectively improve the performance of forward and reverse conduction.

4 Claims, 3 Drawing Sheets

(51) Int. Cl.
*H01L 29/10* (2006.01)
*H01L 29/74* (2006.01)
*H01L 29/739* (2006.01)
*H01L 29/861* (2006.01)

(56) References Cited

U.S. PATENT DOCUMENTS

| | | | | |
|---|---|---|---|---|
| 2015/0318360 A1* | 11/2015 | Lu | ............... | H01L 21/8258 257/192 |
| 2015/0349101 A1* | 12/2015 | Bobde | ............ | H01L 29/7395 257/139 |
| 2017/0025410 A1* | 1/2017 | Cheng | ............ | H01L 27/0727 |
| 2017/0110562 A1* | 4/2017 | Chen | ............ | H01L 29/7397 |

OTHER PUBLICATIONS

Huaping Jiang et al, A Snapback Suppressed Reverse-Conducting IGBT With a Floating p-Region, in Trench Collector, IEEE EDL, vol. 33, No. 3, pp. 417-419, 2012.

\* cited by examiner

REVERSE CONDUCTING IGBT

CROSS REFERENCE

The present application is based on, and claims priority from, Chinese application number 201610786770.2, filed on Aug. 31, 2016, the disclosure of which is hereby incorporated by reference herein in its entirety.

TECHNICAL FIELD

The present invention generally relates to the technical field of the power semiconductor device, more particularly, to a RC-IGBT (Reverse-Conducting Insulated Gate Bipolar Transistor).

BACKGROUND OF THE INVENTION

The RC-IGBT was first fabricated and reported by Hideki Takahashi in the reference "1200V Reverse Conducting IGBT, 04 'ISPSD". The principle is that the antiparallel IGBT and the diode are integrated on a single chip to realize both forward and reverse conduction (as described in FIG. 1). The RC-IGBT has advantages of effectively preventing parasitic effects generated in packaging traditional IGBT and diode and lower manufacturing cost. For the RC-IGBT shown in FIG. 2, at the beginning of the forward conduction of the device, the current flowing through the drift region is the electron current. The electron current is collected by the N-type collector region. This conduction mode is MOSFET mode. When the voltage between the collector and emitter of the device is increased so that the PN junction of the collector region (PN junction formed by the P-type collector region and the N-type field cut-off region) is turned on, a large number of holes begin to inject into the drill region to conduct a conductance modulation effect. Therefore, the forward conduction voltage of the device is significantly reduced. This conduction mode is IGBT mode. Due to the conversion from the MOSFET mode to the IGBT mode, the output characteristic curve of the conventional RC-IGBT shows a negative resistance effect (also called voltage snap-back phenomenon), as shown in FIG. 3.

SUMMARY OF THE INVENTION

Regarding the above issues, the present invention is to provide a RC-IGBT that can eliminate the voltage snapback phenomenon.

According to one aspect of the present invention, a reverse-conducting insulated gate bipolar transistor (RC-IGBT) is provided. A P-type region 1 is formed on the surface of the N-type high resistance semiconductor material. One or more N-type emitter regions 3 and one or more P-type body contact regions 4 are alternately formed on the surface of the P-type region side by side along the lateral direction of the RC-IGBT. Dielectric trenches 2 are formed in central regions of the N-typed emitter regions 3 and pass through the P-type region 1, and the bottom of each dielectric trenches 2 contacts the N-type high resistance semiconductor material. In each dielectric trench are provided an insulating dielectric layer 21 located at the inner wall of the trench and a conductive material 22 surrounded by the insulating dielectric layer 21. The gate electrode is led-out from the conductive material 22 in the dielectric trench to form a trench-gate structure. The common leading-out terminal of the N-type emitter region 3 and the P-type body contact region 4 is the emitter electrode. On the backside of the high resistance N-type semiconductor material, a collector region is formed by N-type regions 51 and P-type regions 52 that are continuously alternately disposed along, the lateral direction of the RC-IGBT. The common leading-out terminal of the N-type regions 51 and the P-type regions 52 are the collectors. An electrical field cutting-off region 6 is introduced on the top of the collector region 5. There is an interval between the electrical field cutting-off region and the collector region in the longitudinal direction of the RC-IGBT. The electrical field cutting-off region 6 is formed by heavily doped N-type regions and lightly doped P-type regions that are continuously alternately disposed along the lateral direction of the RC-IGBT. The lateral direction and the longitudinal direction of the RC-IGBT are in the same plane and vertical to each other.

Above technical solution refers to the trench-gate structure.

Furthermore, the heavily doped N-type regions in the electrical field cutting-off region 6 have the same width along the lateral direction of the RC-IGBT, and the lightly doped P-type regions in the electrical field cutting-off region 6 have the same width along the lateral direction of the RC-IGBT.

According to another aspect of the present invention, an RC-IGBT is provided. P-type well regions 1 are formed on the surface of the N-type high resistance semiconductor material. One or more N-type emitter regions 3 and one or more P-type body contact regions 4 are alternately formed on the surface of the P-type regions side by side along the lateral direction of the RC-IGBT. The N-type emitter region 3 is close to the edge of the P-type well region 1. The P-type body contact region 4 is away from the edge of the P-type well region. The common leading-out terminal of the N-type emitter region and the P-type body contact region is the emitter electrode. There is an interval between the edge of the N-type emitter region 3 and the edge of the P-type well region 1. The surface of the semiconductor between two adjacent N-type emitter regions 3 in two adjacent P-type well regions 1 is covered with gate dielectric. The surface of the gate dielectric is covered with conductive material to form a plane-gate structure and lead out the gate electrode. On the backside of the high resistance N-type semiconductor material, a collector region is formed by a N-type region 51 and a P-type region 52 that are alternately disposed. The common leading-out terminal of the N-type region 51 and the P-type region 52 is the collector electrode. An electrical field cutting-off region 6 is located on the top of the collector region. There is an interval between the electrical field cutting-off region 6 and the collector region in the longitudinal direction of the RC-IGBT. The electrical field cutting-off region 6 is formed by heavily doped N-type regions and lightly doped P-type regions that are continuously alternately disposed along the lateral direction of the RC-IGBT.

The above technical solution refers to the plane-gate structure.

Furthermore, the heavily doped N-type regions in the electrical field cutting-off region 6 have the same width along the lateral direction of the RC-IGBT, and the lightly doped P-type regions have the same width along the lateral direction of the RC-IGBT.

The beneficial effect of the present invention is that, compared with traditional RC-IGBT the IGBT of the present invention can eliminate negative resistance effect and effectively improve the performance of forward and reverse conduction.

DETAILED DESCRIPTION OF THE INVENTION

The technical solution of the invention will be described in detail in combination with the figures and embodiments.

Embodiment 1

Figure 1:
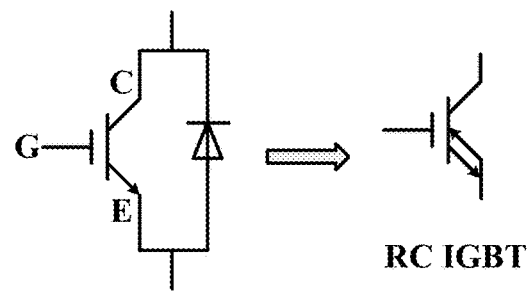
FIG. 1 is a schematic diagram of the RC-IGBT.
Figure 2:
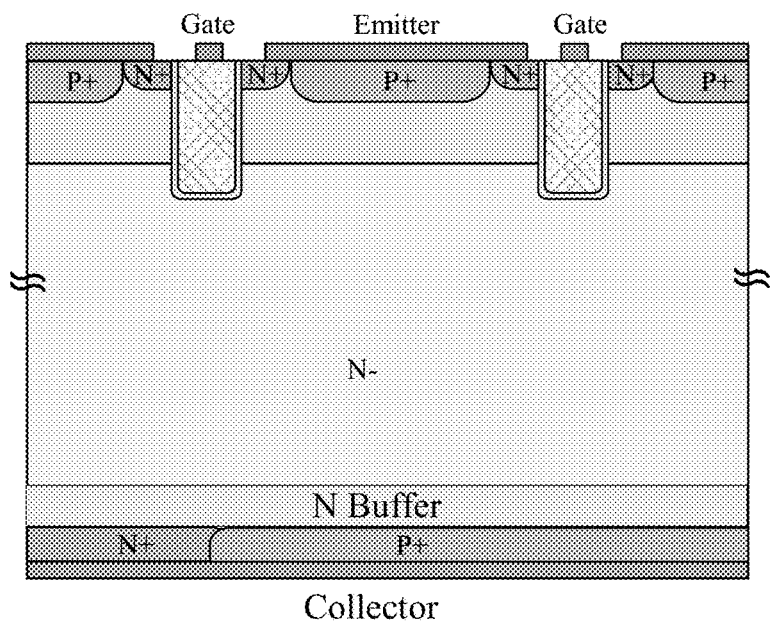
FIG. 2 is structural diagram of the RC-IGBT.
Figure 3:
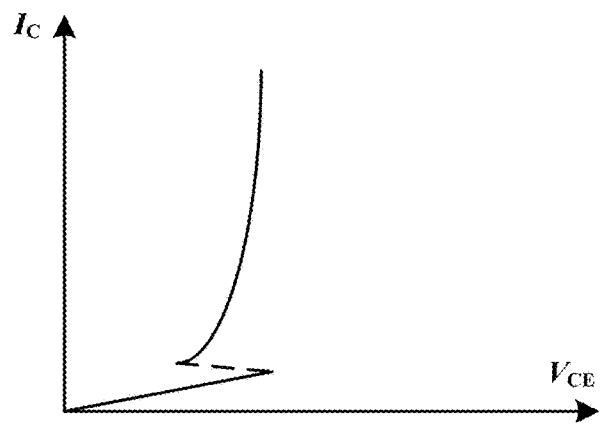
FIG. 3 is a schematic diagram of the voltage snapback of the collector.
Figure 4:
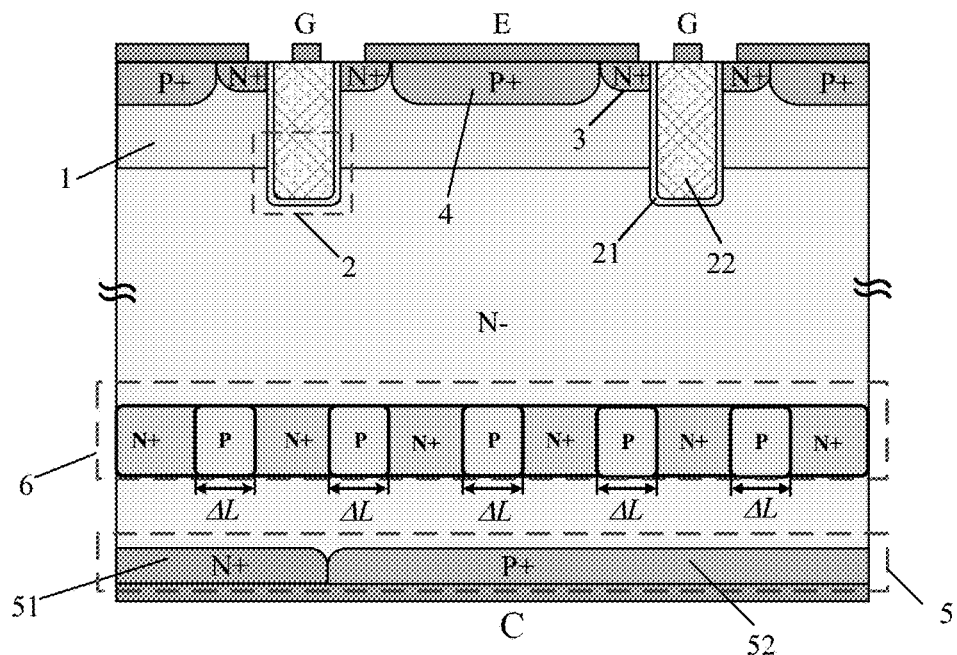
FIG. 4 is a structural schematic diagram of the Embodiment 1.

As depicted in FIG. 4, the present embodiment is a trench-gate RC-IGBT. A P-type region 1 is formed on the surface of the N-type high resistance semiconductor material. One or more N-type emitter regions 3 and one or more P-type body contact regions 4 are alternately formed on the surface of the P-type region side by side along the lateral direction of the RC-IGBT. Dielectric trenches 2 are formed in central regions of the N-typed emitter regions 3 and pass through the P-type region. The bottom of each dielectric trench 2 contacts the N-type high resistance semiconductor. In the dielectric trench 2 are provided an insulating dielectric layer 21 located at the inner wall of the trench and a conductive material 22 surrounded by the insulating dielectric layer 21. The gate electrode is led-out from the conductive material in the dielectric trench to form a trench-gate structure. The common leading-out terminal of the N-type emitter region and the P-type body contact region is the emitter electrode. On the backside of the high resistance N-type semiconductor material, a collector region is formed by N-type regions 51 and P-type regions 52 that are continuously alternately disposed along the lateral direction of the RC-IGBT. The common leading-out terminal of the N-type regions and the P-type regions are the collectors. An electrical field cutting-off region 6 is introduced on the top of the collector region 5. There is an interval between the electrical field cutting-off region and the collector region in the longitudinal direction of the RC-IGBT. The electrical field cutting-off region 6 is formed by heavily doped N-type regions and lightly doped P-type regions that are continuously alternately disposed along the lateral direction of the RC-IGBT. The heavily doped N-type regions in the electrical field cutting-off region 6 have the same width along the lateral direction of the RC-IGBT, and the lightly doped P-type regions in the electrical field cutting-off region 6 have the same width along the lateral direction of the RC-IGBT.

The operational principle of the present embodiment is as follows.

Comparing to the conventional RC-IGBT, the present embodiment uses heavily doped n-type regions and the lightly doped p-type regions to replace the continuous N-buffer layer. The heavily doped N-type regions ensures the electrical field cutting-off effect of the electrical field during the forward blocking state. The lightly doped P-type regions act as an electronic barrier. Therefore, the electronic current flows through the high resistance pathway below the electrical field cutting-off region at the beginning of the forward conduction, the distributed resistance increases, thereby the collection junction can turn on more easily and enter bipolar mode more easily.

Embodiment 2

Figure 5:
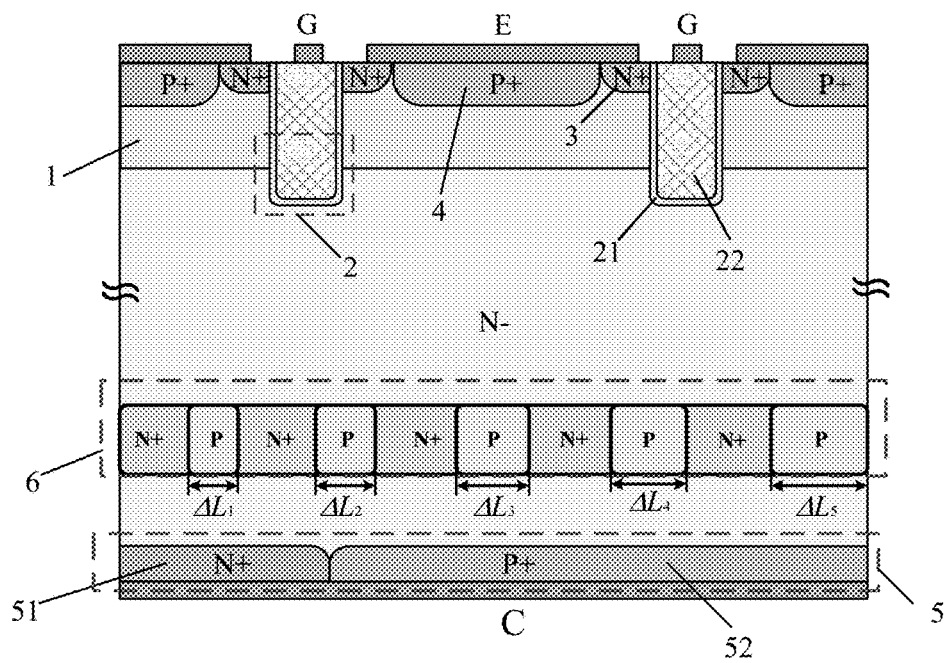
FIG. 5 is a structural schematic diagram of the Embodiment 2.

As depicted in FIG. 5, the present embodiment is a trench gate RC-IGBT. It differs from embodiment 1 in that the heavily doped N-type regions in the electrical field cutting-off region 6 have a same width along the lateral direction of RC-IGBT, while the lightly doped P-type regions in the electrical field cutting-off region 6 have different widths ($\Delta L_1$, $\Delta L_2$, $\Delta L_3$, $\Delta L_4$, $\Delta L_5$) along the lateral direction of the RC-IGBT.

Embodiment 3

Figure 6:
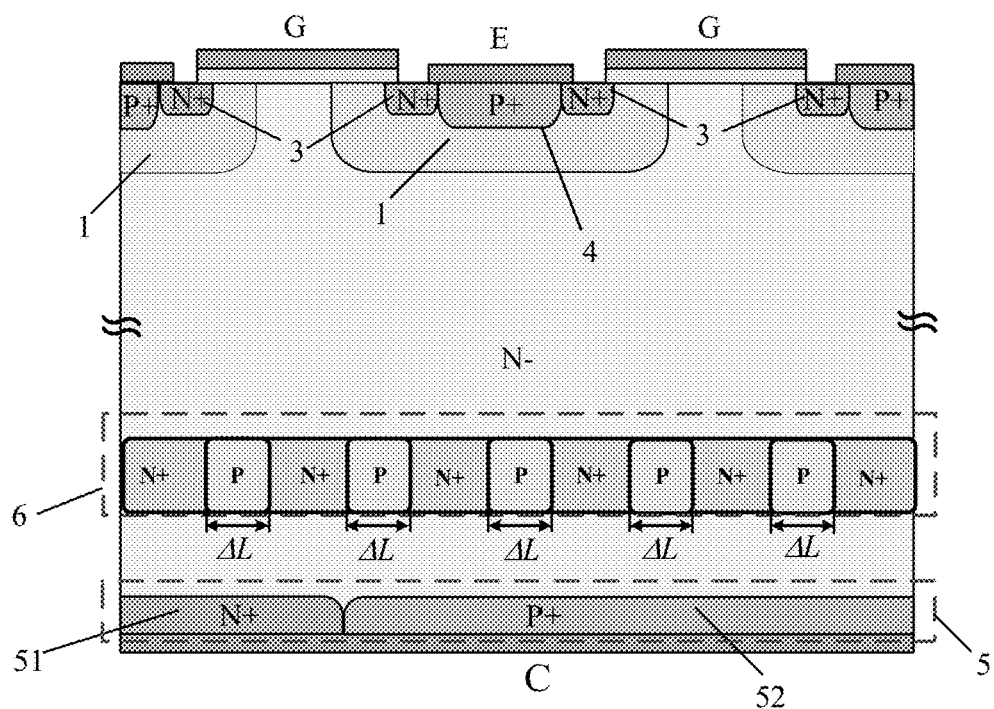
FIG. 6 is a structural schematic diagram of the Embodiment 3.

As depicted in FIG. 6, the present embodiment is a plane gate RC-IGBT. P-type well regions 1 are formed on the surface of the N-type high resistance semiconductor material. N-type emitter regions 3 and P-type body contact regions 4 are alternately formed on the surface of the P-type regions side by side along the lateral direction of the RC-IGBT. The N-type emitter region is close to the edge of the P-type well region. The P-type body contact region is away from the edge of the P-type well region. The common leading-out terminal of the N-type emitter region and the P-type body contact region is the emitter electrode. There is an interval between the edge of the N-type emitter region and the edge of the P-type well region. The surface of the semiconductor between two adjacent N-type emitter regions 3 in two adjacent P-type well regions is covered with gate dielectric. The surface of the gate dielectric is covered with conductive material to form a plane-gate structure and the gate electrode is led out therefrom. On the backside of the high resistance N-type semiconductor material, a collector region is formed by a N-type region 51 and a P-type region 52 that are alternately disposed. The common leading-out terminal of the N-type region and the P-type region is the collector electrode. An electrical field cutting-off region 6 is introduced on the top of the collector region. There is an interval between the electrical field cutting-off region and the collector region in the longitudinal direction of the RC-IGBT. The electrical field cutting-off region 6 is formed by heavily doped N-type regions and lightly doped P-type regions that are continuously alternately disposed along the lateral direction of the RC-IGBT.

Embodiment 4

Figure 7:
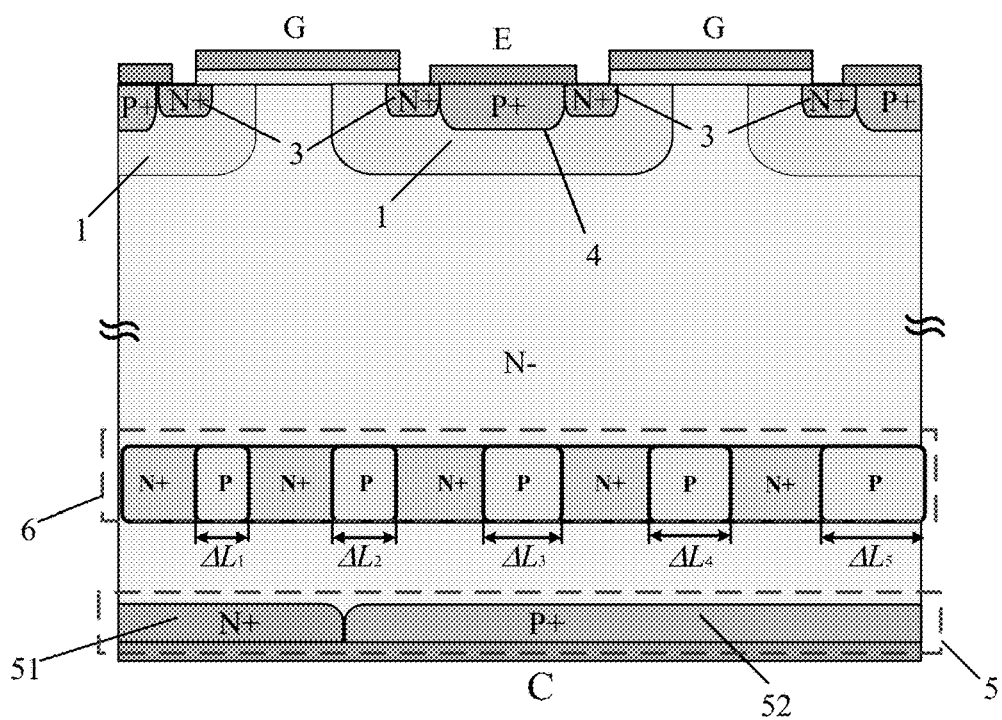
FIG. 7 is a structural schematic diagram of the Embodiment 4.

As depicted in FIG. 7, the present embodiment is a plane gate RC-IGBT. It differs from embodiment 3 in that the heavily doped N-type regions in the electrical field cutting-off region 6 have the same width, while the lightly doped P-type regions in the electrical field cutting-off region 6 have different widths ($\Delta L_1$, $\Delta L_2$, $\Delta L_3$, $\Delta L_4$, $\Delta L_5$) along the lateral direction of the RC-IGBT.

What is claimed is:

1. A reverse conducting insulated gate bipolar transistor (RC-IGBT), comprising:
   a P-type region;
   an N-type emitter region;
   a P-type body contact region;
   a dielectric trench;
   a collector region; and
   an electrical field cutting-off region, wherein
the P-type region is formed on a surface of a N-type high resistance semiconductor material,
the N-type emitter region and the P-type body contact region are alternately formed on a surface of the P-type region side by side along a lateral direction of the RC-IGBT,
the dielectric trench is formed in a central region of the N-typed emitter region and passes through the P-type region,
a bottom of the dielectric trench contacts the N-type high resistance semiconductor material,
in the dielectric trench are provided an insulating dielectric layer located at an inner wall of the dielectric trench and a conductive material surrounded by the insulating dielectric layer,
a gate electrode is led out from the conductive material in the dielectric trench to form a trench-gate structure,
a common terminal led out from the N-type emitter region and the P-type body contact region serves as an emitter electrode,
on a backside of the high resistance N-type semiconductor material, a collector region consists of a N-type area and a P-type area that are continuously alternately disposed along the lateral direction of the RC-IGBT,
a common terminal led out from the N-type area and the P-type area serves as a collector electrode,
an electrical field cutting-off region is provided on the top of the collector region,
there is an interval of the N-type high resistance material between the electrical field cutting-off region and the collector region in a longitudinal direction of the RC-IGBT,
the electrical field cutting-off region is formed by N-type heavily doped regions and P-type lightly doped regions that are continuously alternately disposed along the lateral direction of the RC-IGBT, and
the lateral direction and the longitudinal direction of the RC-IGBT are in the same plane and are perpendicular to each other.

2. The RC-IGBT according to claim 1, wherein the N-type heavily doped regions in the electrical field cutting-off region have the same width along the lateral direction of the RC-IGBT, and the P-type lightly doped regions in the electrical field cutting-off region have the same width along the lateral direction of the RC-IGBT.

3. A reverse conducting insulated gate bipolar transistor (RC-IGBT), comprising:

a plurality of P-type well regions;
a plurality of N-type emitter regions;
a plurality of P-type body contact regions;
a collector region; and
an electrical field cutting-off region,
wherein
the P-type well regions are formed on a surface of a N-type high resistance semiconductor material,
the N-type emitter region and the P-type body contact region are alternately formed side by side along a lateral direction of the RC-IGBT on a surface of the P-type well region, and the N-type emitter region is disposed close to an edge of the P-type well region, and the P-type body contact region is disposed away from the edge of the P-type well region,
a common terminal led out from the N-type emitter region and the P-type body contact region serves as an emitter electrode,
there is a first interval between an edge of the N-type emitter region and an edge of the P-type well region,
a surface of the N-type high resistance semiconductor material that is located between two adjacent N-type emitter regions in two adjacent P-type well regions is covered with gate dielectric,
a surface of the gate dielectric is covered with a conductive material to form a plane-gate structure and a gate electrode is led out from the conductive material,
on a backside of the high resistance N-type semiconductor material, a collector region consists of a N-type area and a P-type area that are alternately disposed along a lateral direction of the IGBT,
a common terminal led out from the N-type area and the P-type area serves as a collector electrode,
an electrical field cutting-off region is provided on the top of the collector region,
there is a second interval of the N-type high resistance material between the electrical field cutting-off region and the collector region in a longitudinal direction of the RC-IGBT, and
the electrical field cutting-off region is formed by N-type heavily doped regions and P-type lightly doped regions that are continuously alternately disposed along the lateral direction of the RC-IGBT.

4. The RC-IGBT according to claim 3, wherein the N-type heavily doped regions in the electrical field cutting-off region have the same width along the lateral direction of the RC-IGBT, and the P-type lightly doped regions in the electrical field cutting-off region have the same width along the lateral direction of the RC-IGBT.

* * * * *